United States Patent [19]
Botti

[11] Patent Number: 4,949,049
[45] Date of Patent: Aug. 14, 1990

[54] BIASING NETWORK FOR INTEGRATED PAIRS OF AMPLIFIERS INTERNALLY COMMUTABLE FROM A SINGLE-ENDED TO A BALANCED CONFIGURATION AND VICEVERSA

[75] Inventor: Edoardo Botti, Mortara, Italy
[73] Assignee: SGS-Thomson Microelectronics s.r.l., Italy
[21] Appl. No.: 342,830
[22] Filed: Apr. 25, 1989
[30] Foreign Application Priority Data
Apr. 27, 1988 [IT] Italy .................. 83631 A/88
[51] Int. Cl.$^5$ ............................... H03F 3/68
[52] U.S. Cl. ............................ 330/124 R; 330/84
[58] Field of Search ............... 330/9, 84, 116, 117, 330/124 D, 124 R, 295, 301, 296

[56] References Cited
U.S. PATENT DOCUMENTS 4,494,077 1/1985 Fukaya et al. .......... 330/124 R X
4,827,221 5/1989 Botti et al. ............... 330/84 X Primary Examiner—Steven Mottola
Attorney, Agent, or Firm—Pollock, Vande Sande & Priddy

[57] ABSTRACT

In an integrated amplifier comprising at least a pair of operational amplifiers which may be connected in a single-ended configuration to form a stereo amplifier or alternatively in a bridge configuration to increase the output dynamics, a single constant current generator for generating a current having a value which is twice the value of the bias current of the input stages of the two operational amplifiers, is connected between an inverting input of one of the two operational amplifiers and ground, and allows for elimination of the offset voltage without contributing to an increase, in any appreciable way, of the noise level at the inputs and without the signal applied to the input terminals of the integrated amplifier causing modulation problems.

2 Claims, 1 Drawing Sheet

BIASING NETWORK FOR INTEGRATED PAIRS OF AMPLIFIERS INTERNALLY COMMUTABLE FROM A SINGLE-ENDED TO A BALANCED CONFIGURATION AND VICEVERSA

BACKGROUND OF THE INVENTION

1. Field of the Invention

The present invention relates to integrated amplifiers and in particular to integrated devices comprising a pair of amplifiers or a plurality of pairs of amplifiers which may be internally connected in a single-ended (stereo) configuration or in a balanced (bridge) configuration and vice-versa.

2. Description of the Prior Art

In recent years integrated circuits containing one or more pairs of operational amplifiers have been developed which may be internally connected, by applying certain biasing voltages to one of the pins of the integrated circuit, in a single-ended configuration or in a balanced or bridge configuration. The possibility of changing the configuration of two integrated amplifiers is particularly useful in the field of audio amplifiers. It allows, by utilizing the same integrated device, the realization of bridge configured audio amplifiers theoretically capable of supplying to the loudspeaker of the sound reproduction system a peak voltage equal to twice the value of the supply voltage, or as it is often the case in lower quality apparatuses, single-ended or stereo configured audio amplifiers having an output dynamics equal to the supply voltage, achieving a somewhat reduced power dissipation and requiring a lesser number of amplifying stages.

U.S. Pat. Nos. 4,827,221 and 4,879,526 to Botti et al assigned to the present Assignee, disclose several integrated devices of this kind.

Naturally each pair of integrated amplifiers, commutable in one or the other configuration commonly by means of integrated analog switches, share biasing networks, feed-back and interconnection networks which are formed normally by passive integrated circuit components. One problem of these internally configurable integrated pairs of amplifiers is the control of the offset voltage and of the noise level of the amplifiers.

By considering for example the circuit diagram of FIG. 1 showing a pair of integrated amplifiers A1 and A2, which may be switched between a single ended a bridge configuration and by noting that the respective input resistances Ri and Ri', which are assumed substantially equal, are commonly much larger than the respective gain resistances Rf1, Rf2 and Rf1', Rf2', it is easily demonstrated that (by assuming equal the ratios Rf1/Rf2 and Rf1'/Rf2') the gain (Vout/Vin) of the two stages (noninverting stage A1 and inverting stage A2) is given by:

$$G = \left(1 + \frac{Rf1}{Rf2}\right) = \left(1 + \frac{Rf1'}{Rf2'}\right)$$

The bias current of the operational amplifiers A1 and A2 is indicated in the diagram of FIG. 1 with I and, for the sake of simplicity, it is assumed equal for all the four inputs.

This bias current does not generate significant voltage drops across the gain resistances Rf1, Rf2, etc., while generates nonneglieable voltage drops across the input resistances Ri and Ri', the value of which is typically at least twice as large as the value of the parallel of the two resistances Rf1 and Rf2.

Being Vp the bias voltage, in a stereo (single-ended) configuration the following relations are satisfied:

$$V_{out1} = (V_p + I \times R_i) \times G$$

$$V_{out2} = (V_p - R_i'' \times I) \times G$$

from which an offset voltage is derived, given by:

$$\Delta V_{out} = 2G \times I \times R_i$$

If the two integrated amplifiers A1 and A2 were connected in a bridge configuration with the two input terminals IN1 and IN2 connected in common, the following relations are satisfied:

$$V_{out} = \left(V_p + \frac{I}{2} \times R_i\right) \times G$$

$$V_{out2} = \left(V_p - \left(I + \frac{I}{2}\right) \times R_i''\right) \times G$$

and the offset voltage is given by:

$$\Delta V_{out} = 2G \times I \times R_i$$

This offset voltage is excessive in many cases.

According to a known solution depicted in FIG. 2, two current generators I1 and I2, respectively connected between the non inverting input and ground and between the inverting input and ground, are employed. This solution has the drawback of requiring two current generators, but above all the generator I1 connected between the noninverting input of the amplifier A1 and ground is subject to modulation by the input signal which is applied to the IN1 terminal. This may cause harmonic distorsion of the input signal and of the output signal in a measure as large as the series resistance of the input signal source.

Another type of known bias network theoretically capable of ensuring a null offset is depicted in the diagram of FIG. 3, wherein:

$$R_{i2} = R_i \text{ and } R_{i1} = R_i''$$

It is possible to demonstrate that with such a circuit the offset is theoretically null by connecting as well as by disconnecting the input terminals IN1 and IN2. This is possible so far as each input of the operational amplifiers A1 and A2 has the same resistance causing the same voltage drop. Consequently the two outputs Vout 1 and Vout 2 assume the same potential.

Such a bias network is disadvantageous due to the fact that the resistances Ri1 and Ri2, which are not indispensable to the operation of the amplifier except for the offset problem, greatly increase the noise level at the inputs of the amplifiers.

SUMMARY OF THE INVENTION

A purpose of the present invention is to provide a bias network for configurable integrated pairs of amplifiers which permits the elimination of the offset voltage add is exempt of the drawbacks of the antioffset bias networks of the prior art with respect to the noise level of the amplifiers.

BRIEF DESCRIPTION OF THE DRAWINGS

In the accompanying drawings.

DESCRIPTION OF THE PREFERRED EMBODIMENT(S)

Figure 1:
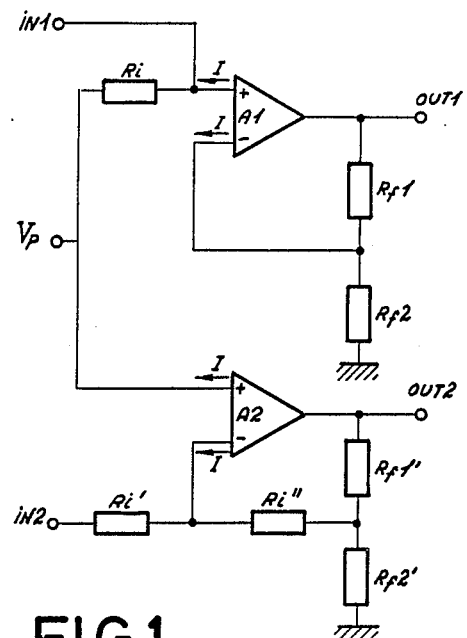
FIGS. 1, 2 and 3 depict circuit diagrams showing the condition which generates an offset voltage and the bias networks of the prior art for counterbalancing such an offset voltage.
Figure 3:
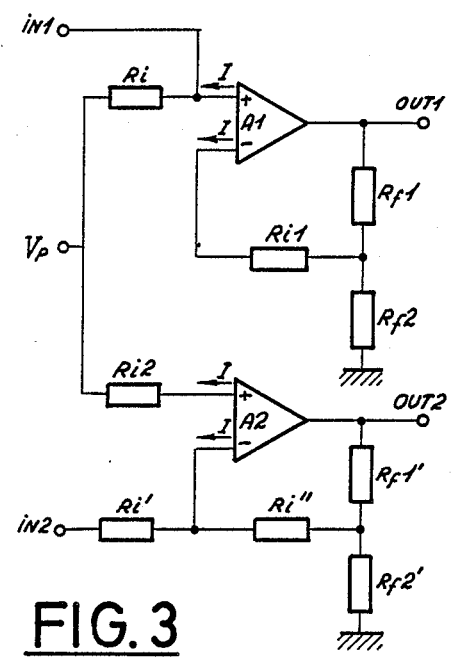
Figure 2:
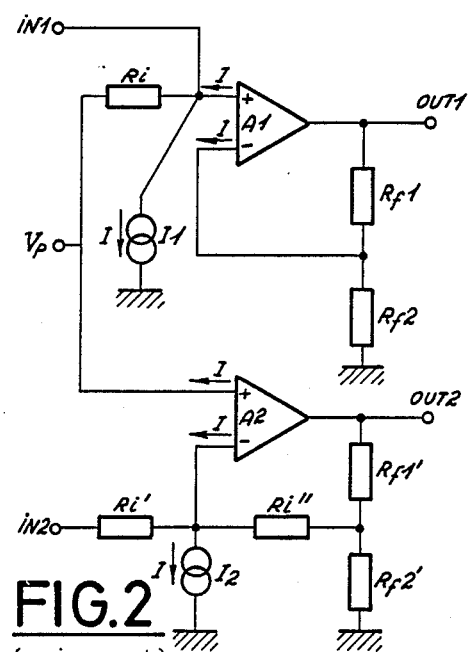
Figure 4:
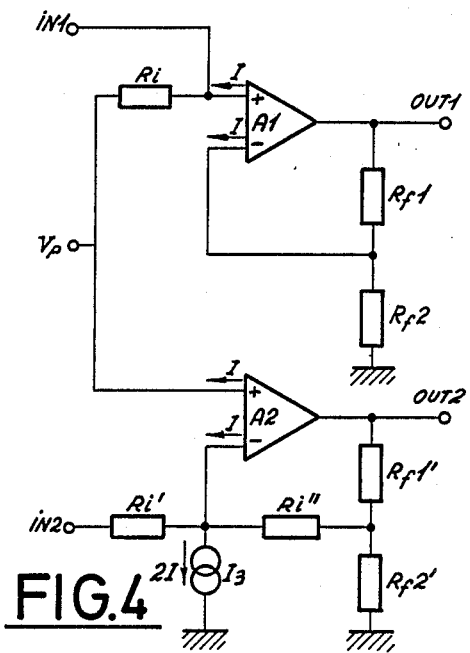
FIG. 4 is a circuit diagram according to the present invention showing the bias network for integrated pairs of amplifiers which may be internally switched between a single-ended configuration and a bridge configuration.

Referring to the circuit diagram of FIG. 4 showing the present invention circuit, a current generator 13 is connected between the inverting input of the amplifier A2 and the ground which delivers a current 2I equal to twice the value of the bias input current I of the operational amplifiers A1 and A2.

In a single-ended configuration of the two amplifiers, the output voltages at the respective output terminals OUT 1 and OUT 2 are given by:

$$V\text{out1} = (Vp + I \times Ri) \times G$$

$$V\text{out2} = (Vp - (I - 2I) \times Ri') \times G = (Vp + I \times Ri') \times G$$

and therefore:

$$V\text{out1} = V\text{out2}$$

In a bridge configuration, with the two input terminals IN1 and IN2 connected in common, the output voltages are given by:

$$V\text{out1} = \left(Vp + Ri \times \frac{I}{2}\right) \times G$$

$$V\text{out2} = \left(Vp - Ri'' \left(I - \frac{I}{2} - 2I\right)\right) \times$$

$$G = \left(Vp + Ri'' \times \frac{I}{2}\right) \times G$$

and therefore also in this case:

$$V\text{out1} = V\text{out2}$$

Accordingly, an efficient nullification of the offset voltage is achieved, in the present invention circuit, by means of a single current generator I3 connected between the inverting input of the amplifier A2 and ground. This solution is remarkably advantageous as compared to the above known solutions.

The problem related to the modulation by an input signal of the current delivered by the current generator directly connected to the input terminal for controlling the offset according to the prior art is substantially overcome.

Moreover the circuit of the present invention for controlling the offset does not negatively affect, in any substantial way, the conditions relative to the input noise level as it was the case with one of the prior art techniques as discussed above.

What I claim is:

1. An input bias network for an integrated pair of operational amplifiers, which may be switched between a single-ended and a bridge configuration to form a desired amplifier circuit, capable of preventing generation of an offset voltage, said network comprising:

means for connecting a constant voltage ($V_p$) source through a first resistance (Ri) to a noninverting input of a first operational amplifier of said pair, constituting a first input terminal (IN1) of the circuit, and directly to a noninverting input of a second amplifier of said pair, an inverting input of which is connected through a second resistance (Ri') to a second input terminal (IN2) of the circuit, said constant voltage (Vp) source forcing the passage of a substantially identical bias current through inverting inputs and noninverting inputs of both said operational amplifiers; and a single, constant current generator (13) for the input bias network for generating a current, the value of which is twice the value of said bias current, said generator being connected between the inverting input of the second operational amplifier and a ground node of the circuit for nullifying an input offset voltage.

2. An integrated amplifier having two input terminals and two output terminals and comprising:

a pair of operational amplifiers each having a noninverting input, an inverting input and an output, the noninverting input of a first operational amplifier being directly connected to a first input terminal of the integrated amplifier, the inverting input of a second operational amplifier being connected to a second input terminal through a first resistance, and the outputs of said operational amplifiers being connected respectively to said two output terminals of the amplifier;

an input bias network including means for applying a constant bias voltage (Vp) through a second resistance to the noninverting input of said first operational amplifier and directly to the noninverting input of said second operational amplifier for forcing a bias current through the inputs of said two operational amplifiers;

the operational amplifiers being functionally connectable in a single-ended or in a bridge configuration by individually utilizing the two input terminals or the two input terminals connected in common to form a single input terminal, respectively; and a single, constant current generator for the integrated amplifier for generating a current having a value which is twice the value of said bias current imposed through the inputs, said generator being connected between the inverting input of said second operational amplifier and a common ground node of the integrated amplifier for nullifying an input offset voltage.

* * * * *